United States Patent
Dickey et al.

(10) Patent No.: US 9,263,359 B2
(45) Date of Patent: Feb. 16, 2016

(54) MIXED METAL-SILICON-OXIDE BARRIERS

(71) Applicants: Eric R. Dickey, Portland, OR (US); Bryan Larson Danforth, Portland, OR (US)

(72) Inventors: Eric R. Dickey, Portland, OR (US); Bryan Larson Danforth, Portland, OR (US)

(73) Assignee: Lotus Applied Technology, LLC, Hillsboro, OR (US)

(*) Notice: Subject to any disclaimer, the term of this patent is extended or adjusted under 35 U.S.C. 154(b) by 0 days.

(21) Appl. No.: 14/191,235

(22) Filed: Feb. 26, 2014

(65) Prior Publication Data
US 2014/0242736 A1 Aug. 28, 2014

Related U.S. Application Data

(60) Provisional application No. 61/770,230, filed on Feb. 27, 2013.

(51) Int. Cl.
| | |
|---|---|
| *H01L 21/00* | (2006.01) |
| *H01L 23/29* | (2006.01) |
| *H01L 23/00* | (2006.01) |
| *H01L 51/52* | (2006.01) |

(52) U.S. Cl.
CPC ............ *H01L 23/291* (2013.01); *H01L 23/564* (2013.01); *H01L 51/5253* (2013.01); *H01L 2924/0002* (2013.01)

(58) Field of Classification Search
CPC .............................. H01L 23/26; H01L 23/564
USPC .......................................................... 438/26
See application file for complete search history.

(56) References Cited

U.S. PATENT DOCUMENTS

| | | | |
|---|---|---|---|
| 2004/0195967 A1 | 10/2004 | Padiyath et al. | |
| 2005/0106877 A1 | 5/2005 | Elers et al. | |
| 2005/0163924 A1 | 7/2005 | Anderson et al. | |
| 2011/0165394 A1 | 7/2011 | Hirose et al. | |
| 2012/0003484 A1* | 1/2012 | Roehrig et al. | 428/447 |
| 2012/0250314 A1 | 10/2012 | Maikowski et al. | |

FOREIGN PATENT DOCUMENTS

| | | |
|---|---|---|
| EP | 0 436 741 A1 | 7/1991 |
| KR | 100647702 B1 * | 11/2006 |
| WO | 2005/074330 A1 | 8/2005 |
| WO | 2005/104634 A2 | 11/2005 |

OTHER PUBLICATIONS

A. A. Dameron, S. D. Davidson, B. B. Burton, P. F. Carcia, R. S. McLean, and S. M George, "Gas Diffusion Barriers on Polymers Using Multilayers Fabricated by Al2O3 and Rapid SiO2 Atomic Layer Deposition," J. Phys. Chem. C, vol. 112, pp. 4573-4580, Mar. 5.

(Continued)

*Primary Examiner* — Brook Kebede
(74) *Attorney, Agent, or Firm* — Stoel Rives LLP

(57) ABSTRACT

A method of forming a thin barrier film of a mixed metal-silicon-oxide is disclosed. For example, a method of forming an aluminum-silicon-oxide mixture having a refractive index of 1.8 or less comprises exposing a substrate to sequences of a non-hydroxylated silicon-containing precursor, activated oxygen species, and metal-containing precursor until a mixed metal-silicon-oxide film having a thickness of 500 Ångstroms or less is formed on the substrate.

20 Claims, 3 Drawing Sheets

(56) References Cited

OTHER PUBLICATIONS

B.J. Skinner and D.E. Appleman, "Melanophlogite, A Cubic Polymorph of Silica," The American Mineralogist, vol. 48, Jul.-Aug. 1963.

BP, P.L.C., "Naphthalates," 11 pages, Aug. 2001.

D. Hausmann, J. Becker, S. Wang, R. G. Gordon, "Rapid Vapor Deposition of Highly Conformal Nanolaminates," Science, vo. 298, pp. 402-406, Oct. 11, 2002.

G. Dingemans, C. A. A. Van Helvoirt, M. C. M. Van De Sanden, and W. M. M. Kessels, "Plasma-Assisted Atomic Layer Deposition of Low Temperature $SiO_2$," ECS Transactions, v. 35, issue 4, pp. 191-204, May 1, 2011.

I. Suzuki, C. Dussarrat, and K. Yanagita, "Extra Low-Temperature $SiO_2$ Deposition Using Aminosilanes," ECS Transactions, vol. 3, No. 15, pp. 119-128, Oct. 30, 2006.

International Search Report and Written Opinion, mailed Jun. 11, 2014 in International Patent Application No. PCT/US2014/018765.

J.D. Ferguson, A.R. Yoder, A.W. Weimer, and S.M. George, "$TiO_2$ Atomic Layer Deposition on $ZrO_2$ Particles Using Alternating Exposures of $TiCl_4$ and $H_2O$," Applied Surface Science, vol. 226, No. 4, pp. 393-404, Mar. 30, 2004.

J.W. Lim, S.J. Yun, and H.-T. Kim, "Characteristics of $Al_xTi_{1-x}O_y$ films grown by plasma-enhanced atomic layer deposition," Electrochem. Soc., v. 154, issue 11, pp. G239-G243, Sep. 6, 2007.

J.W. Lim, S.J. Yun, and J.H. Kim, "Optical and electronic properties of $Ti_xSi_{1-x}O_y$ films," ETRI Journal, v. 31, No. 6, pp. 675-679, Dec. 2009.

M. Ritala, K. Kukli, A. Rahtu, P. I. Raisanen, M. Leskela, T. Sajavaara, J. Keinonen, "Atomic Layer Deposition of Oxide Thin Films with Metal Alkoxides as Oxygen Sources," Science, vol. 288, pp. 319-321, Apr. 14, 2000.

Y. Tomczak, K. Knapas, S. Haukka, M. Kemell, M. Heikkila, M. Ceccato, M. Leskela, and M. Ritala, "In Situ Reaction Mechanism Studies on Atomic Layer Deposition of $Al_xSi_yO_z$ from Trimethylaluminum, Hexakis (ethylamino)disilane, and Water," Chemistry of Materials, Oct. 12, 2012, vol. 24, pp. 3859-3867.

\* cited by examiner

MIXED METAL-SILICON-OXIDE BARRIERS

RELATED APPLICATIONS

This application claims the benefit of U.S. Provisional Application No. 61/770,230 entitled MIXED METAL-SILICON-OXIDE BARRIERS, filed Feb. 27, 2013.

TECHNICAL FIELD

The field of the present disclosure relates to mixed metal-silicon-oxide barrier films and processes for deposition of such barrier films.

BACKGROUND

Gases, liquids, and other environmental factors may cause deterioration of various goods, such as food, medical, and electrical devices, pharmaceutical products. Thus, conventionally, barrier films have been included on or within the packaging associated with sensitive goods to prevent or limit the permeation of gases or liquids, such as oxygen and water, through the packaging during manufacturing, storage, or use of the goods.

Atomic layer deposition (ALD) is a thin film deposition process described in U.S. Pat. No. 8,137,464 of Dickey et al. ("the '464 patent"), filed Mar. 26, 2007 as U.S. application Ser. No. 11/691,421 and entitled Atomic Layer Deposition System and Method for Coating Flexible Substrates, and in U.S. Pat. No. 8,202,366 of Dickey et al. ("the '366 patent"), filed Apr. 6, 2010 as U.S. application Ser. No. 12/755,239 and entitled Atomic Layer Deposition System Utilizing Multiple Precursor Zones for Coating Flexible Substrates. Thin film deposition in accordance with the methods and systems disclosed in the '464 and '366 patents has been proposed for deposition of barrier films on flexible substrates for packaging for sensitive goods and other uses.

Conventional wisdom holds that nanolaminates make better barrier films than mixed materials. See, for example, U.S. Pat. No. 4,486,487 disclosing nanolaminates with $Al_2O_3$ and $TiO_2$ layers and U.S. Pat. No. 7,294,360 disclosing nanolaminates with $Al_2O_3$ and $SiO_2$ layers formed from trimethylaluminum (TMA, or $Al_2(CH_3)_6$ (as a dimer)) and tris-(tert-butoxy)silanol. Complex multilayer barrier films including five or six pairs of alternating organic and inorganic layers have been used to prevent the permeation of oxygen and water through plastic substrates of organic light-emitting diodes (OLEDs). Some such barriers are so-called nanolaminates made by ALD, formed from discrete, individual layers typically having thicknesses under 10 nanometers (nm). However, multilayer barriers result in a relatively high overall barrier thickness that is not ideal for thin film flexible packaging. Moreover, thick film stacks may affect light transmission through the barrier film.

Applicants recognized that mixed AlTiO films may act as a moisture barrier (e.g., films having a thickness of less than approximately 3 or 4 nm may exhibit a water vapor transmission rate (WVTR) of less than 0.005 $g/m^2/day$) and may exhibit a refractive index of approximately 1.8-1.9, as disclosed in U.S. application Ser. No. 13/546,930 ("the '930 application"), filed Jul. 11, 2012. While these films may be comparatively thinner than nanolaminate structures formed from alumina and titania, a need remains for barrier films having very low steady-state vapor permeability and very low optical transmission loss.

DETAILED DESCRIPTION OF PREFERRED EMBODIMENTS

Figure 1:
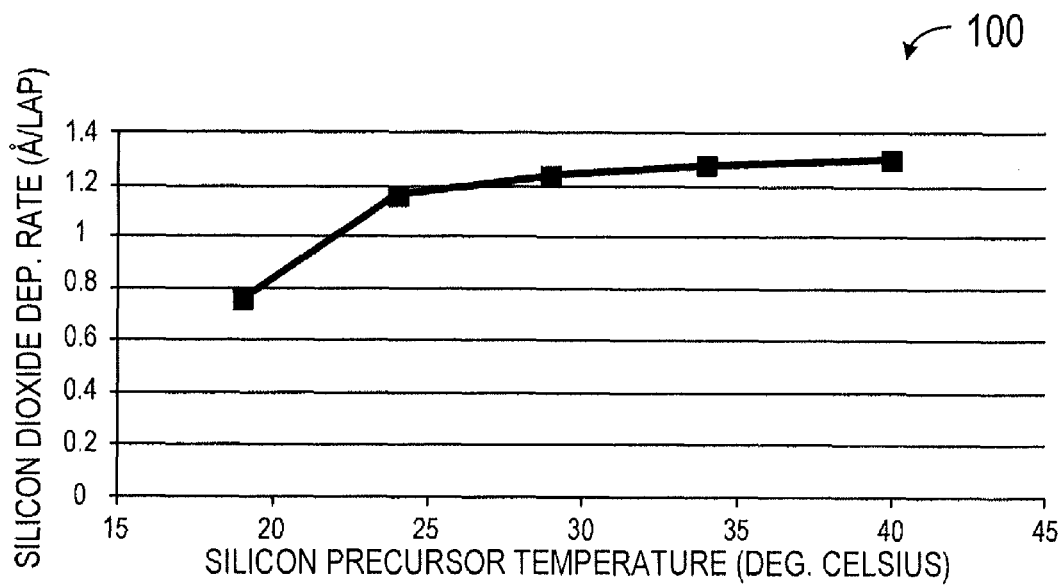
FIG. 1 is a graph illustrating self-limiting deposition rate data for a silicon dioxide film as a function of silicon precursor vaporization temperature.

Some nanolaminate barrier structures may be expected to interfere with light transmission. In some settings where the thicknesses of the laminated layers are within a few orders of magnitude of the light wavelength (e.g., at least 3-5 nm thick), light refraction at interfaces formed between the laminated layers may cause losses in light transmission where the layers have different refractive indices. Light transmission losses may be compounded in settings where light is transmitted through the underlying substrate, as in OLEDs and in light-transmissive packaging materials, because the materials used to build the barrier film may have refractive indices that are also different from the refractive index of the substrate material. For example, water vapor barriers are often applied to polyethylene terephthalate (PET) polymer substrate.

As explained in more detail below, Applicants realized that silicon dioxide ($SiO_2$, also known as silica) is a material that has a refractive index of about 1.46, lower than that of PET, which would be expected to enhance light transmission because of the somewhat antireflective behavior of silicon dioxide on PET. However, $SiO_2$ exhibits poor water vapor barrier properties. Aluminum oxide ($Al_2O_3$, also known as alumina) also has a refractive index near that of PET, but Applicants found that $Al_2O_3$ decomposes when exposed to high-humidity/high-temperature environments, making it a risky choice for moisture barrier applications.

In contrast, Applicants recognized that titanium dioxide ($TiO_2$, also known as titania) formed using an oxygen-containing plasma makes an excellent water vapor barrier and is stable in high-humidity environments, as disclosed in U.S. application Ser. No. 12/632,749, filed Dec. 7, 2009 and published as US 2010/0143710 A1 ("the '710 publication"). However, Applicants found that $TiO_2$ has a refractive index much higher than that of PET, which can degrade light transmission when applied to a PET substrate, particularly as the $TiO_2$ film thickness increases. Similarly, mixtures, of AlTiO form an excellent water vapor barrier, though the refractive index of those mixtures, noted above, is also higher than that of PET.

In accordance with the present disclosure, a barrier film comprises a mixed metal-silicon-oxide deposited on a substrate using ALD processing of a non-hydroxylated silicon-containing precursor (that is, a silicon precursor that is not a silanol, or put differently, does not have a hydroxyl group attached to the silicon atom), a metal-containing precursor, and activated oxygen species formed from an oxygen-containing compound.

In some embodiments, a metal-silicon-oxide mixture may exhibit a lower refractive index relative to a version of the metal oxide that is substantially free of silicon (that is, a version of the metal oxide consisting essentially of the metal oxide), depending on the lattice parameters for the metal oxide and the metal-silicon-oxide materials. Inclusion of silicon may lower the refractive index of the metal oxide, potentially reducing or eliminating optical transmission losses resulting from diffraction at the interface with the underlying substrate material.

In some embodiments, a metal-silicon-oxide mixture may be deposited on a flexible polymer substrate at a temperature of about 200 degrees Celsius or lower. Deposition of a metal-silicon-oxide mixture at a temperature of about 200 degrees Celsius or lower may prevent thermal degradation of polymer substrates that are thermally-sensitive, such as on substrates that experience a color change at or have glass transition temperature at about 200 degrees Celsius or less. For example, PET thermally degrades at about 100 degrees Celsius; polyethylene naphthalate (PEN) thermally degrades at about 150 degrees Celsius; polyetherertherketone (PEEK) thermally degrades at about 180 degrees Celsius, and some polyimide substrates may be thermally stable to 200 degrees Celsius or above. In such embodiments, the precursors are selected to be reactive or sensitive to the activated oxygen species at a temperature of about 200 degrees Celsius or lower. As explained in more detail below, however, the precursors may not be sensitive with one another or with the oxygen-containing compound(s) at these temperatures, which may discourage gas-phase reaction between latent amounts of the precursors and the oxygen-containing compounds.

Non-limiting examples of such metal-silicon-oxide mixtures that may be formed according to embodiments of the present disclosure include $Ti_xSi_yO_z$, $Al_xSi_yO_z$, and $Zn_xSi_yO_z$ films. Herein and in the claims, a metal-silicon-oxide mixture may be referred to as "$M_xSi_yO_z$", where "M" represents a suitable metal atom and where x, y, and z represent a ratio of metal, silicon, and oxygen atoms, respectively. Like nomenclature may also be used as a short-hand reference to metal oxides (e.g., "$M_xO_z$") and silicon oxides (e.g., "$Si_yO_z$").

Metal-silicon-oxide mixtures also have been found to exhibit moisture barrier properties superior to silicon oxides and some metal oxides alone. Table 1 presents a range of WVTR data collected from 20-nm-thick $SiO_2$ films in an as-deposited state (that is, without further processing) formed using variations on an ALD process described in more detail below. As shown in Table 1, each of the $SiO_2$ films demonstrated a poor WVTR of 1.5 g/m²/day or greater, comparatively worse than the WVTR of $Al_2O_3$, $TiO_2$, and mixed AlTiO films. Film composition data for one example $SiO_2$ film was measured using Rutherford backscattering spectrometry (RBS). The RBS measurments showed that the film was a stoichiometric $SiO_2$ film substantially free of carbon. That is, the deposition process formed a film consisting essentially of silicon dioxide, and substantially free of silicon suboxides and carbon contaminants.

TABLE 1

| Speed (m/min) | Process Temperature (° C.) | Thickness (Å) | As-Deposited WVTR (g/m²/day) |
|---|---|---|---|
| 15 | 100 | 206 | 1.5 |
| 30 | 100 | 206 | >6 |
| 7.5 | 100 | 197 | 3.4 |
| 30 | 60 | 211 | >6 |

It can be difficult to visually detect small defects (e.g., pinholes, scratches, embedded particles, or other film irregularities that disrupt the integrity of the barrier film) in thin film barrier materials using optical microscopy or, in some cases, scanning electron microscopy. However, evidence of small defects can be obtained by exposing a substrate coated with a barrier material to a substance that is chemically reactive with the substrate (e.g., a substrate-sensitive reactant). For example, PET is chemically reactive with concentrated sulfuric acid (e.g., 96% $H_2SO_4$). Even small point defects in a barrier material may, when exposed to concentrated sulfuric acid, introducing the acid to the PET film. In turn, the acid etches a visibly recognizable region of the PET film that may be much larger than the defect size. In this example, the sulfuric acid is removed with a deionized water rinse and the sample is dried with nitrogen gas. Subsequent inspection (e.g., using a high-intensity halogen light source for illumination and a dark colored background for contrast) reveals, via optical microscopy or unaided visual inspection, the etched regions of the PET substrate, indicating the presence of defects in the barrier material.

Exposure of an $SiO_2$-coated PET web to concentrated sulfuric acid did not reveal visible signs of defects in the silicon dioxide film (i.e., there were no visible indicia of acid-induced PET degradation). However, visual inspection of an $SiO_2$-coated PET substrate exposed to steam saturated with water vapor (that is, saturated steam) at ambient pressure indicated that the $SiO_2$ film offered no protection from attack by $H_2SO_4$. That is, based on the damage to the PET substrate caused by the sulfuric acid, the steam-exposed silicon dioxide film is understood as being easily permeated by the acid.

The $SiO_2$ films used to collect the WVTR data shown in Table 1 were formed via plasma-enhanced ALD on Melinex® ST-504 PET substrates sold by DuPont Teijin Films. The PET substrate was processed as a flexible web arranged to travel in a loop within the deposition system. An example deposition system is described in more detail below with reference to FIG. 5. In each experiment, the substrate web was arranged in a "loop-mode" configuration, in which the substrate web travels along a single path in an endless band or loop within the deposition system. When depositing a single oxide film (for example, the $SiO_2$ films presented in Table 1), each transit, or lap, of the path subjects the substrate to a single ALD cycle. One example $SiO_2$ deposition process formed approximately 1.3 Ångstrom of film per lap, as determined from a 20-nm $SiO_2$ film. However, it will be appreciated that in some processes, two or more ALD cycles may be performed during each lap, where each cycle deposits a particular oxide material used to form the mixed metal-silicon-oxide. For example, a substrate may be circulated along a path X number of times to attain 2× ALD cycles—half for the first precursor and half for the second precursor (expressed as: $X*(1*SiO_x+1*MO_x)$ herein). Put another way, one lap of the substrate band results in two ALD cycles (also referred to as an ALD cycle pair) forming a mixture of metal-silicon-oxide material. Examples of such processes are described in more detail below.

The $SiO_2$ films used to collect the WVTR data shown in Table 1 were deposited on a substrate temperature of 100 degrees Celsius, within an acceptable tolerance, using silanediamine, N,N,N',N'-tetraethyl, a non-hydroxylated silicon-containing precursor. Other examples of such precursors are discussed in more detail below. In these experiments, silanediamine, N,N,N',N'-tetraethyl was vaporized at a temperature of 40 degrees Celsius, within an acceptable tolerance, which corresponds to a temperature at which chemisorption of the silicon precursor self-limits on the substrate under the processing conditions described above, as illustrated in graph 100 shown in FIG. 1. Of course, other precursors may have different vaporization (or sublimation, if stored as a solid precursor) temperatures according to their respective thermodynamic properties. Further, some non-hydroxylated silicon-containing precursors may be gases under typical storage conditions and may be supplied directly in gaseous form.

For the example silicon dioxide films discussed with respect to Table 1, the chemisorbed silicon precursor was exposed to oxygen radicals generated by decomposing or cracking an oxygen-containing compound. In these experiments, oxygen radicals were generated by plasma excitation or activation of a gaseous oxygen-containing compound. The oxygen radicals generated by the plasma were supplied directly to the substrate surface. Specifically, the substrate was directly exposed to a plasma supplied with dry air (that is, a gaseous mixture consisting essentially of oxygen and nitrogen) at 1.4 Torr total pressure and excited by a DC plasma generator operating at 150 W. Put another way, the substrate was placed in direct contact with at least a portion of the plasma region and the oxygen radicals generated therein.

While the silicon dioxide films discussed above exhibited poor (high) WVTR, metal-silicon-oxide mixtures formed using a non-hydroxylated silicon-containing precursor exhibit a refractive index typically in the range of 1.5-1.8. When formed at temperatures of about 200 degrees Celsius or less, such mixtures may be suitable for use with a thermally-sensitive, light-transmissive flexible polymer substrates such as PET, having a refractive index in a range of 1.55-1.64; PEN, having a refractive index in a range of 1.65-1.9; and PEEK, having a refractive index in a range of 1.65-1.77. As explained in more detail below, metal-silicon-oxide mixtures so formed also exhibit low WVTR suitable for use in moisture barrier applications, including use in packaging materials for foods, medical devices, pharmaceutical products, and semiconductor devices, among others.

In contrast to many prior methods of forming multi-layer barriers, metal-silicon-oxide mixtures formed according to the present disclosure may have no detectably distinct layers. That is, they represent a substantially homogenous mixture, or mixed, metal-silicon-oxide. As used herein, a homogeneous mixture represents a material substantially free of discrete or individually-identifiable layers or strata. For example, an image of a cross-section of a homogeneous mixed film, collected by a suitable microscopy technique such as transmission electron microscopy or scanning electron microscopy, would not be expected to show crisp boundaries or interfaces between materials within the film.

In some embodiments, a homogeneous mixture may be characterized as being free from abrupt changes in elemental concentration throughout the thickness of the film. Abrupt concentration changes may signal transitions between material compositions or phases within the film. In some embodiments, a homogeneous mixture may be characterized by a substantially unchanging elemental concentration throughout the thickness of the film. That is, the mixture may have substantially the same elemental concentration throughout, though it will be appreciated that there may be an acceptable amount of concentration variation near the terminal interfacial boundaries of the mixture (e.g., where the mixture interfaces with another substance) caused by, among other things, surface relaxation and interfacial mixing with another substance.

Embodiments of homogeneous metal-silicon-oxide mixtures may be formed by ALD using surface-chemisorbed amounts of non-hydroxylated silicon and metal precursors that react with activated oxygen species supplied to the surface, the activated oxygen species being generated from an oxygen-containing compound. Examples of such, precursors and compounds are described in more detail below.

Figure 2:
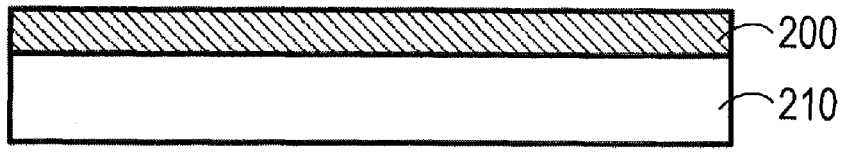
FIG. 2 is a schematic cross-section illustrating an embodiment of a substrate with a single mixed metal-silicon-oxide film deposited thereon.
Figure 3:
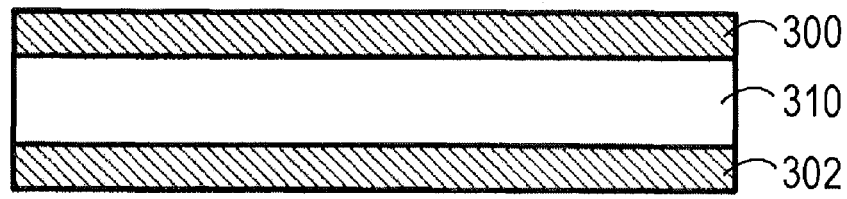
FIG. 3 is a schematic cross-section illustrating an embodiment of a substrate with mixed metal-silicon-oxide film deposited on opposing sides of the substrate.

In some embodiments, metal-silicon-oxide mixtures may be formed from successive ALD deposition events, or cycles, where each ALD cycle deposits a particular variety of oxide material (e.g., a silicon oxide or a metal oxide). FIG. 2 illustrates a cross section of a single thin film barrier film of mixed $M_xSi_yO_z$ 200 deposited on a substrate 210 (also referred to as a single-sided barrier film). FIG. 3 illustrates a cross section of first and second thin film barrier films 300 and 302 of mixed $M_xSi_yO_z$ deposited on opposite sides of a substrate 310 (also referred to as a double-sided barrier). In some embodiments, substrates 210 and 310 may be flexible substrates. Non-limiting examples of flexible substrates include PET, PEN, PEEK, and polyimide substrates. Of course, substrates 210 and 310 need not be flexible. In some embodiments, substrates 210 and 310 may be rigid. For example, substrate 310 may represent a completed OLED display or lighting panel or a rigid glass or other sheet. In some of such embodiments, barrier films 300 and 302 may completely encapsulate substrate 310, so that barrier film 300 abuts barrier film 302 (and may bond or join therewith) to form a wrapper or shroud that encloses substrate 310 and isolates it from ambient exposure.

As used herein, chemisorption of a species refers to the chemical adsorption of that species to a surface through formation of a chemical bond. The resulting chemisorbed species may have a thickness that is less than three monolayers thick, including submonolayer coverage amounts. Chemisorption does not refer to the formation of a condensed phase, or a physically adsorbed ("physisorbed") phase of a species. While physisorbed phases experience a weak attraction to the underlying surface through van der Waals forces, these phases do not form chemical bonds with the surface. For example, amounts in excess of three monolayers would be expected to be phyisorbed due to the difficulty in forming chemical bonds as such distances.

Reactions A through D set forth a simple example for the formation of a metal-silicon-oxide mixture using a pair of ALD cycles according to an embodiment of the present disclosure. In the example, Reactions A and B represent an ALD cycle used to deposit a silicon oxide material on an exposed surface supported by the substrate. Reactions C and D represent an ALD cycle used to form a metal oxide material on the surface. Of course, the order of the ALD cycles forming the cycle pair may be suitably reordered in some embodiments, and in some embodiments the order of the reactions one or both pairs may be reordered. For example, thermally-cracked activated oxygen species may be chemisorbed to the surface prior to chemisorption of the non-hydroxylated silicon-containing precursor and/or the metal-containing precursor.

Reaction A represents chemisorption of a non-hydroxylated silicon-containing precursor on a surface supported by the substrate resulting from exposure of the surface to the precursor. Non-limiting examples of non-hydroxylated silicon-containing precursors include compounds such as tris (dimethylamino)silane ($SiH[N(CH_3)_2]_3$); tetra(dimethylamino)silane ($Si[N(CH_3)_2]_4$; bis(tertiary-butylamino)silane ($SiH_2[HN(CH_3)_3]$); trisilylamine (($SiH_3)_3N$) (available under the trade name TSA from L'Air Liquide S.A.); silanediamine, N,N,N',N'-tetraethyl ($SiH_2[N(C_2H_5)_2]_2$) (available under the trade name SAM.24™ from L'Air Liquide S.A.); and hexakis(ethylamino)disilane ($Si_2(NHC_2H_5)_6$) (available under the trade name AHEAD™ from L'Air Liquide S.A.).

The surface is represented as a $M_xO_z$-containing surface for the purpose of illustrating the surface condition at some point after the commencement of deposition of the metal-silicon-oxide mixture. Naturally, other surface conditions, including a bare substrate surface or another film or coating supported by the substrate, may be exposed to the precursor when deposition is initiated.

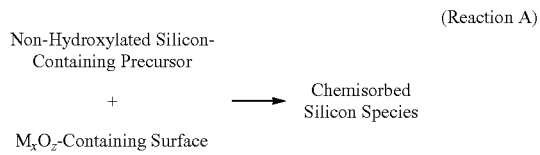

(Reaction A)

Reaction B represents exposure of the chemisorbed silicon species to the activated oxygen species to form a silicon oxide on the surface. In the example shown in Reaction B, the activated oxygen species are oxygen radicals. Approaches for forming oxygen radicals are discussed in more detail below.

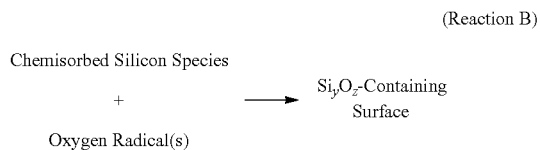

(Reaction B)

Oxygen atoms included in the metal-silicon-oxide are provided by reaction of an activated oxygen species formed from an oxygen-containing compound supplied to the reactor in an oxygen precursor. That is, activated oxygen species supplied to the surface react with chemisorbed metal or silicon species.

An oxygen-containing compound may be a mixture or may consist essentially of a single compound. In some embodiments, an oxygen-containing compound to which the metal and/or silicon precursors are insensitive may be selected, so that co-mingling of the oxygen-containing compound with another precursor will not result in adventitious film and/or particle formation. Put differently, the oxygen-containing compound may be selected so that the activated oxygen species is reactive with the chemisorbed metal and silicon species while the oxygen-containing compound is not, as described in U.S. Pat. No. 8,187,679 of Dickey et al., filed Jul. 26, 2007 and entitled Radical-Enhanced Atomic Layer Deposition System and Method, which is incorporated by reference.

In some embodiments, the activated oxygen species may include oxygen radicals generated by plasma activation of the oxygen-containing compound. For example, a plasma supplied with an oxygen-containing gas consisting essentially of dry air (including dry air synthesized from a blend of nitrogen and oxygen gases) may generate the oxygen radicals for the mixtures. Other non-limiting examples of gaseous oxygen-containing compounds include one or more of carbon monoxide (CO), carbon dioxide ($CO_2$), nitrogen monoxide (NO), and nitrogen dioxide ($NO_2$), and mixtures of nitrogen ($N_2$) and carbon dioxide. In some embodiments, an oxygen plasma may directly contact the substrate (e.g., a direct plasma), though indirect (e.g., remote plasma) activation and transport of oxygen radicals to the substrate surface may be employed in some embodiments.

Other radical activation energy sources and plasma ignition/stabilization gases may also be employed without departing from the scope of the present disclosure. In some embodiments, activated oxygen species including ozone ($O_3$) may be generated, remotely or proximal to the substrate, from an oxygen-containing compound. In some embodiments, activated oxygen species may be generated by thermally decomposing or cracking an oxygen-containing compound. Hydrogen peroxide ($H_2O_2$) is a non-limiting example of an oxygen-containing compound that may be used in a thermally activated ALD process. Oxygen radicals generated from hydrogen peroxide may react with chemisorbed metal or silicon species to form a mixed metal-silicon-oxide. In some of such embodiments, $H_2O_2$ may be blended with water ($H_2O$) as water vapor to alter the concentration of oxygen radicals by shifting the kinetic equilibrium of the radical formation process.

Owing to the chemisorption process shown in Reaction A, the amount of silicon oxide formed on the surface may be about three monolayers or less. Consequently, there may be, within the deposited oxide, openings, gaps, islands, or other features associated with the formation of a discontinuous, incomplete, partial, or submonolayer amount of silicon oxide. As an example, an ALD process for depositing silicon dioxide (process precursors: silanediamine, N,N,N',N'-tetraethyl vaporized at 40 degrees Celsius and oxygen radicals formed using a plasma supplied with dry air at 1.4 Torr total pressure; process conditions: substrate temperature of 100 degree Celsius, DC plasma operated at 200 W) had a deposition rate of about 1.4 Å per ALD cycle. For reference, silicon dioxide has a theoretical monolayer thickness of about 3.7 Å. Accordingly, under these process conditions, silicon dioxide is expected to be formed in submonolayer amounts.

Submonolayer amounts of metal oxides may also be formed according to embodiments of the present disclosure. An example ALD process for forming titanium dioxide performed at 100 degrees Celsius using $TiCl_4$ and plasma-generated oxygen radicals had a deposition rate of about 1 Å per ALD cycle, while an example ALD alumina-forming process using TMA and plasma-generated oxygen radicals performed at the same temperature had a deposition rate of about 1.6 Å per ALD cycle. For comparison, $TiO_2$ has a theoretical monolayer thickness of about 2.2 Å, and the theoretical monolayer thickness for $Al_2O_3$ is approximately 3.6 Å.

Continuing with the example reaction scheme described above, Reaction C represents chemisorption of a metal-containing precursor to the silicon oxide-containing surface. As suggested by the experimental silicon dioxide and metal oxide film thickness data described above, the metal-containing precursor may chemisorb to the silicon oxide as well as to material underlying the silicon oxide so that openings or discontinuities within the silicon oxide are occupied by chemisorbed metal species. Transition and/or non-transition metal atoms are incorporated into the mixture by reaction of chemisorbed metal species formed from a metal-containing compound supplied to the reactor in a metal-containing precursor. Non-limiting examples of metal-containing precursors include compounds such as metal halide compounds (e.g., titanium tetrachloride, or $TiCl_4$) and metalorganic compounds (e.g., diethylzinc ((DEZ) or $Zn(C_2H_5)_2$) and TMA). Chemisorbed metal species then react with oxygen radicals to form a surface that contains metal oxide, as indicated in Reaction D.

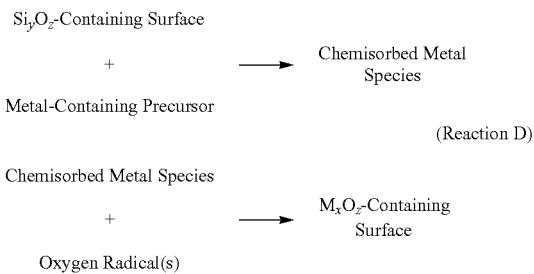

(Reaction C)

Si$_y$O$_z$-Containing Surface + Metal-Containing Precursor → Chemisorbed Metal Species (Reaction D)

Chemisorbed Metal Species + Oxygen Radical(s) → M$_x$O$_z$-Containing Surface

Without wishing to be bound by theory, keeping the thickness added by each oxide during an instance of oxide deposition to less than about three monolayers is believed to aid in the formation of a homogeneous, mixed oxide. The presence of gaps or openings or other discontinuities that result from depositing oxide amounts of less than about three monolayers may provide space therein for subsequent chemisorption and reaction of another precursor, leading to a blended film. Keeping the amount of oxide that is added to less than about three monolayers may also prevent the development of a long-range lattice structure for that type of oxide, potentially preventing stratification that may cause the material to resemble a nanolaminate.

Embodiments of metal-silicon-oxide materials formed according to the present disclosure exhibit deposition rates that are consistent with formation of homogeneous mixed oxides. Deposition rate data for example Al$_x$Si$_y$O$_z$ and Ti$_x$Si$_y$O$_z$ films indicates that, on the basis of a pair of ALD cycles (e.g., a silicon oxide-forming ALD cycle and a metal oxide-forming ALD cycle), each pair of cycles forms a mixed oxide film having a thickness that is less than a theoretical stack consisting of each oxide. That is, each pair of cycles deposits a film having a thickness that is less than the theoretical monolayer thickness of silicon dioxide (3.7 Å) added to the theoretical monolayer thickness of the metal oxide (2.2 Å for TiO$_2$ or 3.6 Å for Al$_2$O$_3$). An embodiment of an Al$_x$Si$_y$O$_z$ film has a deposition rate of about 4.5 Å/pair of ALD cycles, less than a theoretical thickness of 3.7 Å+3.6 Å=7.3 Å for stacked structure of SiO$_2$ and Al$_2$O$_3$. An embodiment of a Ti$_x$Si$_y$O$_z$ film has a deposition rate of about 3.0 Å/pair of ALD cycles, less than the theoretical thickness of 3.7 Å+2.2 Å=5.9 Å for a stacked structure of SiO$_2$ and TiO$_2$.

While the mixed oxide deposition rates do not indicate multilayer structures, each mixed oxide was formed at a rate that exceeded the rates of formation of the individual oxides included in the films. Put another way, the thickness of film formed by a pair of ALD cycles (that is, a silicon oxide-forming cycle and a metal oxide-forming cycle) actually exceeded the sum of the thicknesses of the oxides formed by the individual ALD cycles therein. Thus, the thickness of a Ti$_x$Si$_y$O$_z$ film formed from one pair of ALD cycles (about 3.0 Å) is greater than the sum of the thickness of a TiO$_2$ film formed by a single ALD cycle and the thickness of an SiO$_2$ film formed by a single ALD cycle (about 1 Å+about 1.4 Å, or about 2.4 Å). Likewise, the thickness of an Al$_x$Si$_y$O$_z$ film formed from one pair of ALD cycles (about 4.5 Å) is greater than the sum of the thickness of a Al$_2$O$_3$ film formed by a single ALD cycle and the thickness of an SiO$_2$ film formed by a single ALD cycle (about 1.6 Å+about 1.4 Å, or about 3.0 Å). Depositing comparatively thicker films for a given number of ALD cycles may permit increased substrate throughput and/or fewer ALD cycles. Such synergistic increases in deposition rate may potentially speed substrate processing, reduce deposition system size, and so on.

Film composition data observed for examples of metal-silicon-oxide materials formed according to the present disclosure are also consistent with the formation of homogeneous mixed oxides. RBS testing of a 20-nm Al$_x$Si$_y$O$_z$ film showed that the film included about 16.4 at % silicon, 16.6 at % aluminum, and 67.0 at % oxygen. The RBS data is believed to be consistent with the formation of blended Al$_2$O$_3$:SiO$_2$ film having a slightly greater proportion of SiO$_2$ than Al$_2$O$_3$. The RBS measurements detected no carbon contamination throughout the entire depth of the 20-nm film. As another example, the 3.0 Å/layer deposition rate of Ti$_x$Si$_y$O$_z$ was more than the sum of the 1.0 Å/cycle pair rate for TiO$_2$ and the 1.4 Å/cycle pair rate for SiO$_2$. RBS testing of a 20-nm Ti$_x$Si$_y$O$_z$ film showed that the film included about 20.5 at % silicon, 9.5 at % titanium, and 70.0 at % oxygen, and no carbon contamination throughout the entire depth of the 20-nm film. As with the example discussed above, the RBS data is believed to be consistent with the formation of blended TiO$_2$:SiO$_2$ film having a slightly greater proportion of SiO$_2$ than TiO$_2$.

Metal-silicon-oxide mixtures may consist of tens, hundreds, or thousands of repetitions of such ALD cycles, depending on the desired thickness. In some embodiments, an ALD process for depositing one oxide material may be repeated two or more times in succession before switching to a different ALD process used to deposit a different oxide material. In such embodiments, the number of repetitions is selected so that the resulting mixture exhibits the homogenous characteristics described above. As one example, a process for forming a homogeneous metal-silicon-oxide mixture may include performing up to five ALD cycles for one oxide material before switching to an ALD cycle for a different oxide material. In some embodiments, mixtures may be formed by no more than about 10 Å of one oxide, preferably no more than about 8 Å of one oxide, and more preferably no more than about 6 521 of one oxide, before switching to another oxide. In some embodiments, the number of repetitions may be selected so that no more than about three monolayers of one oxide are formed on the surface before switching to another oxide.

Precursor selection may also affect oxide thickness by altering the surface coverage of precursor molecules. For example, a non-hydroxylated silicon-containing precursor may prevent the formation of thick, stoichimetric SiO$_2$ layers via siloxane polymerization. Some hydroxylated silicon precursors (that is, silanols) may react with metal atoms, forming permeable siloxane polymer intermediates. Siloxane polymer intermediates may ultimately form stoichiometric SiO$_2$ films. As an example, tris(tert-butyl)silanol was used to form a thick silica layer included in an Al$_2$O$_3$/SiO$_2$ laminated film stack, as described by D. Hausmann, J. Becker, S. Wang, and R. G. Gordon in "Rapid Vapor Deposition of Highly Conformal Silica Nanolaminates," v. 298, Science, Oct. 11, 2002. As explained by Gordon et al., the hydroxyl group present in the silanol is believed to be critical to the polymerization reaction, facilitating concerted displacement reactions that lead to insertion of another silanol monomer at the aluminum atom. Only subsequent cross-linking of the siloxane polymer prevented further diffusion, reaction, and growth of the SiO$_2$ layer. Gordon et al. reported more than 32 monolayers of SiO$_2$ formed from a single, self-limiting exposure of tris(tert-butyl) silanol to an aluminum-containing oxide surface. Accordingly, a non-hydroxylated silicon-containing precursor is preferably used to form chemisorbed silicon species during processing to avoid potential siloxane polymerization and the attendant thick layer of silicon dioxide resulting therefrom.

Precursor functionality may also affect surface coverage of the chemisorbed species. Put differently, a fraction of a surface occupied by chemisorbed precursor species may vary according to the precursor. Precursor functional group characteristics may alter the surface population of chemisorbed precursor. In some embodiments, precursor chemisorption may be adjusted by varying the size of one or more functional groups contained in the precursor. For example, the larger tert-butyl groups present in bis(tertiary-butylamino)silane may sterically hinder chemisorption of that precursor to a greater extent than the smaller ethyl groups present in silanediamine, N,N,N',N'-tetraethyl. This may potentially reduce the ability of bis(tertiary-butylamino)silane to chemisorb to the surface, possibly leaving additional space for later chemisorption of metal species in resulting gaps or discontinuities.

As another example of the role of precursor functionality in film formation, the functional group(s) included in a precursor may also alter reactivity with active oxygen species. Without wishing to be bound by theory, it may be possible that the increased deposition rate observed for mixed metal-silicon-oxide films relative to the rates for observed metal oxide or silicon dioxide films formed under similar ALD conditions may be related to the reactivity of the silicon-containing precursor. For example, silanediamine, N,N,N',N'-tetraethyl silicon precursor may be more readily oxidized than TMA or $TiCl_4$, potentially being converted at a greater extent or a faster rate for a given substrate speed and plasma condition relative to those metal precursors. This characteristic may be shared by other amide- or amine-based silicon compounds. Accordingly, in some embodiments, any suitable amide- or amine-based silicon compounds that is also not a silanol may be used without departing from the scope of the present disclosure.

As introduced above, the presence of silicon and a metal within an oxide mixture of the present disclosure may cause the mixture to exhibit physical characteristics of each oxide. For example, an aluminum-silicon-oxide film formed according to the present disclosure was found to have a refractive index of about 1.55, much closer to the refractive index of PET than the refractive index of the AlTiO mixtures reported in the '930 application (approximately 1.8).

Figure 4:
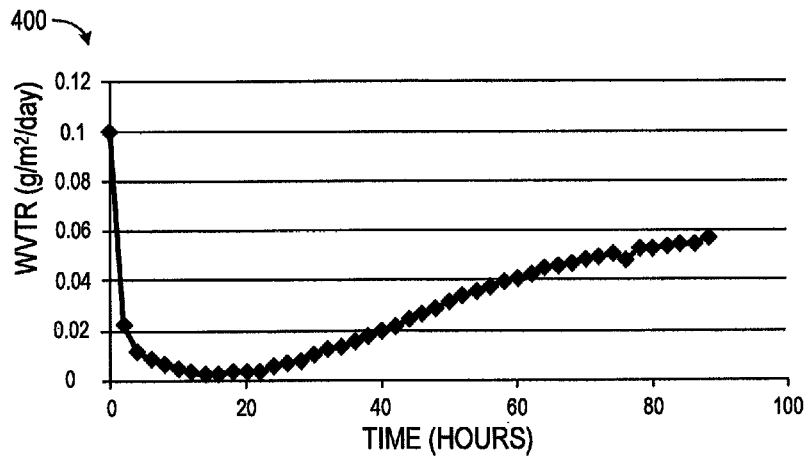
FIG. 4 is a graph illustrating time-dependent water vapor transmission rate data for an embodiment of an aluminum-silicon oxide film.

WVTR testing of an embodiment of an aluminum-silicon-oxide mixture according to the present disclosure suggests that the mixture exhibits some time-dependent moisture barrier properties that are characteristic of $Al_2O_3$. FIG. 4 depicts time-dependent changes in water vapor transmission rate for an embodiment of an $Al_xSi_yO_z$ film during a 90-hour period following deposition. WVTR data 400 was collected from a 6-nm $Al_xSi_yO_z$ film formed on a PET substrate at 100 °C. using silanediamine, N,N,N',N'-tetraethyl; TMA; and oxygen radicals generated using a 1.4 Torr dry air DC plasma operated at 200 W. As shown in FIG. 4, after a brief transient period of about 16 hours, the film exhibits an initial water vapor transmission rate of approximately $3 \times 10^{-3}$ g/m²/day. The initial transmission rate gradually rose to a water vapor transmission rate of approximately $6 \times 10^{-2}$ g/m²/day after 90 hours. Rather than signaling a degradation in barrier performance, it is believed that the shift in WVTR may be related to the presence of aluminum oxide within the $Al_xSi_yO_z$ film.

Similarly, silicon atoms present within the $Al_xSi_yO_z$ film may provide resistance to high humidity/high temperature environments. Unlike $Al_2O_3$ films, embodiments of the $Al_xSi_yO_z$ films of the present disclosure do not decompose when directly exposed to steam. Table 2 summarizes WVTR data for embodiments of $Al_xSi_yO_z$ films exposed to steam saturated with water vapor at a temperature of approximately 99 degrees Celsius for seven hours before measurement. The $Al_xSi_yO_z$ films represented in Table 2 were formed on PET substrates transported at different rates and processed at 100° C. using silanediamine, N,N,N',N'-tetraethyl; TMA; and oxygen radicals generated by a 1.4 Torr, dry air, DC plasma operated at 200 W. The steamed aluminum-silicon-oxide films performed better than $Al_2O_3$ films, which immediately decomposed upon exposure to saturated steam. Moreover, the steamed aluminum-silicon-oxide films exhibit about the same WVTR as steam-exposed AlTiO films, which exhibited a WVTR of about $3 \times 10^{-1}$ g/m²/day.

TABLE 2

| Speed (m/min) | Process Temperature (° C.) | Thickness (Å) | After 7-hr Steaming WVTR (g/m²/day) |
|---|---|---|---|
| 15 | 100 | 197 | $3 \times 10^{-1}$ |
| 15 | 60 | 218 | $1 \times 10^{-1}$ |
| 30 | 100 | 181 | $2 \times 10^{-1}$ |
| 7.5 | 100 | 223 | $8 \times 10^{-3}$ |

Subsequent exposure to concentrated sulfuric acid after 7 hours of exposure to saturated steam showed nearly pinhole-free coating of the PET web, indicating good acid resistance. Exceptionally, the acid study revealed a small a local film nucleation defect which is believed responsible for the WVTR result in that sample. Thus, embodiments of aluminum-silicon-oxide mixtures are expected to be suitable for use in moisture barrier applications, including use in packaging materials for foods, medical devices, pharmaceutical products, and semiconductor devices, among others. Embodiments of aluminum-silicon-oxide mixtures are also expected to be suitable for directly encapsulating flexible and rigid devices, including encapsulation of a completed OLED displays or lighting panels to glass or other substrates in sheet processing.

Table 3 presents WVTR data for 20-nm $Ti_xSi_yO_z$ films formed under different web speed conditions on PET substrates at 100° C. using silanediamine, N,N,N',N'-tetraethyl; $TiCl_4$; and oxygen radicals generated using a 1.4 Torr, dry air, DC plasma operated at 200 W. The substrate was pre-treated with a low speed, one-lap exposure to a 1.2 Torr, oxygen, DC plasma at 200 W. While the WVTR of these films is slightly higher relative to the aluminum-silicon-oxide films described above, the titanium-silicon-oxide films had a stable WVTR and did not exhibit the upward shift in barrier performance before re-stabilizing exhibited by the aluminum-silicon-oxide films.

TABLE 3

| Speed (m/min) | As-Deposited Film WVTR (g/m²/day) | After 7-hr Steaming WVTR (g/m²/day) |
|---|---|---|
| 15 | $7 \times 10^{-3}$ | $2.8 \times 10^{-1}$ |
| 7.5 | — | $6.5 \times 10^{-2}$ |

For comparison, the as-deposited titanium-silicon-oxide mixture exhibited a WVTR that was slightly higher than that of $TiO_2$. After 7 hours of steam exposure, the mixture exhibited a WVTR about the same as $TiO_2$. Exposure of samples 4A and 4B to concentrated sulfuric acid after exposure to saturated steam for 7 hours showed good defect performance (i.e., good acid resistance and low acid attack of the PET substrate), though some localized film delamination was apparent. As another example, a titanium-silicon-oxide film formed according to the present disclosure was estimated to have a refractive index of about 1.7 based upon RBS concentration assessment. In comparison, the refractive index of $Al_2O_3$ deposited by ALD is approximately 1.6, the refractive index of an aluminum-silicon-oxide mixture deposited according to embodiments of the present disclosure is about 1.55, and the refractive index for $SiO_2$ is approximately 1.46, as noted above. Thus, titanium-silicon-oxide mixtures are expected to be suitable for use in moisture barrier applications on light-transmissive flexible polymer substrates, including use in packaging materials for foods; medical devices, pharmaceutical products, and semiconductor devices, among others. Embodiments of titanium-silicon-oxide mixtures are also expected to be suitable for directly encapsulating flexible and rigid devices, including encapsulation of a completed OLED displays or lighting panels to glass or other substrates in sheet processing.

Figure 5:
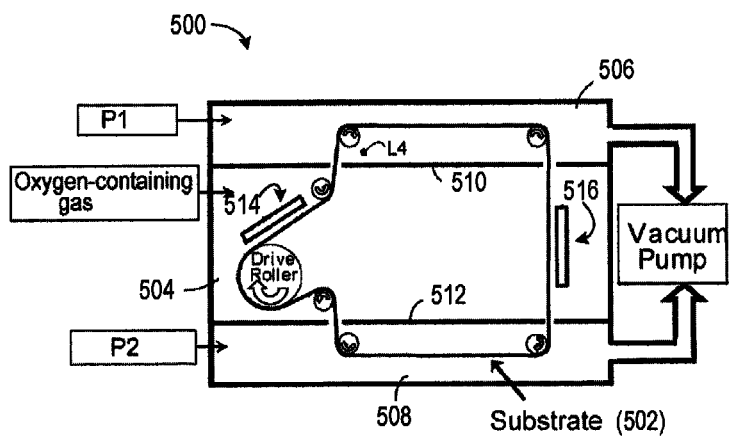
FIG. 5 is a schematic cross-section view illustrating a system for thin film deposition on a flexible web configured in a loop.

FIG. 5 schematically shows an embodiment of a roll-to-roll deposition system 500 that may be used to form mixed metal-silicon-oxide films according to embodiments of the present disclosure. Roll-to-roll deposition system 500 is consistent with deposition systems described in the '464 patent and especially with the system of FIG. 5 of the '710 publication. With reference to FIG. 5, a "loop-mode" configuration wraps a substrate web 502 into an endless band (loop), which includes a single path that performs two ALD cycles on each revolution (lap), as the substrate moves from the central isolation zone 504, into the first precursor zone 506, back to the isolation zone 504, to the second precursor zone 508, and to finish back in the isolation zone 504. As the substrate web 502 travels between zones 504, 506, and 508, it passes through slit valves, which may be formed as slots in divider plates 510, 512 that separate the different zones. In this configuration the substrate web 502 can be passed repeatedly through the precursor and isolation zones (e.g., sequentially from zone 504→506→504→508) in a closed loop. This system is referred to herein as a "roll-to-roll" deposition system, even though the loop substrate configuration used for experimental purposes does not involve transporting the substrate from a feed roll to an uptake roll.

In the loop configuration illustrated in FIG. 5, a full traverse of the loop path results in two ALD deposition cycles when two plasma generators 514, 516 are employed in isolation zone 504. In yet another embodiment, a stacked reactor configuration may utilize a multi-zone stack, such as the five-zone stack illustrated in FIG. 5 of the '366 patent, wherein a metal-containing precursor is introduced in the top and bottom precursor zones and a silicon precursor is introduced in a middle precursor zone, or vice versa, and oxygen radicals are generated from oxygen-containing compound introduced in the intermediate isolation zones separating the respective metal and silicon precursor zones.

Figure 6:
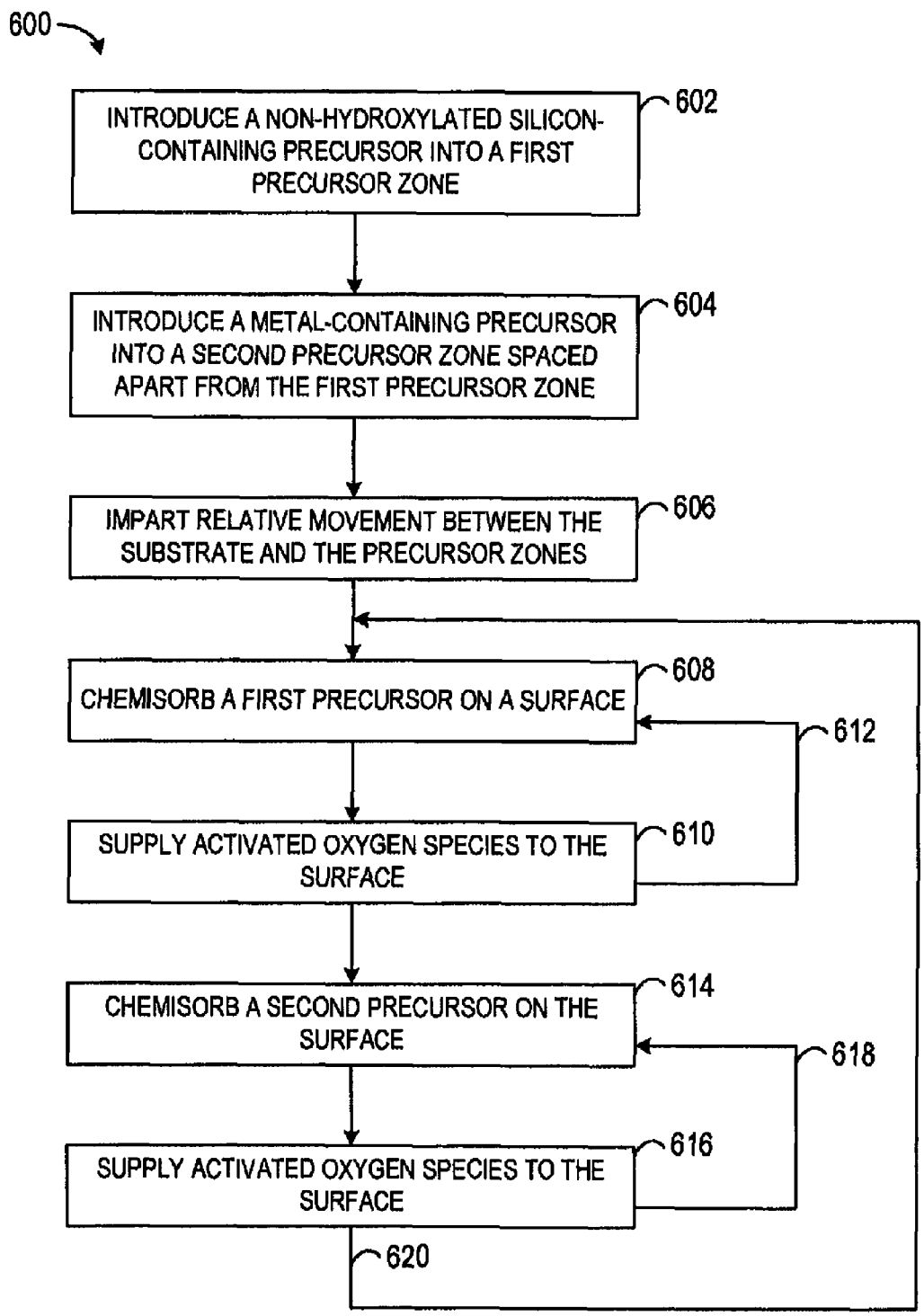
FIG. 6 is a flowchart for an embodiment of a method for depositing a metal-oxide-silicon film.

FIG. 6 is an embodiment of a method 600 for depositing a metal-silicon-oxide film on a substrate. It will be understood that the films described herein may be formed using any suitable film deposition system, including embodiments of roll-to-roll deposition system 500.

At 602, method 600 includes introducing the non-hydroxylated silicon-containing precursor into a first precursor zone and introducing the metal-containing precursor into a second precursor zone spaced apart from the first precursor zone. For example, with reference to roll-to-roll deposition system 500, a silicon precursor may be supplied to first precursor zone 506 and a metal-containing precursor may be supplied to second precursor zone 508.

At 604, method 600 includes introducing a dry, oxygen-containing compound into an isolation zone positioned between the first and second zones so as to create a positive pressure differential between the isolation zone and the first and second zones. With reference to system 500, an oxygen-containing compound may be supplied to isolation zone 504. At 606, method 600 includes imparting relative movement between the substrate and precursor zones.

Method 600 includes, at 608, chemisorbing a first precursor on a surface supported by the substrate by exposing the surface to one of a non-hydroxylated silicon-containing precursor or a metal-organic precursor and afterward, at 610, supplying activated oxygen species to the surface.

In some embodiments, supplying activated oxygen species to the surface may include cracking the dry, oxygen-containing compound so as to generate the activated oxygen species. In some of such embodiments, a plasma generator (e.g., a DC plasma source, an RF plasma source, or an inductively-coupled plasma source) may energize and decompose a dry gaseous oxygen-containing compound (for example dry air, $O_2$, $CO_2$, CO, NO, $NO_2$, or mixtures of two or more of the foregoing, with or without added nitrogen ($N_2$) and/or another suitable inert carrier gas) flowing through the isolation zone at a pressure slightly higher than the first and second precursor zones into activated oxygen species. In some other embodiments, an oxygen-containing compound, for example, hydrogen peroxide, water, or a mixture thereof, may be decomposed or cracked via non-plasma activation (e.g., a thermal process). In still other embodiments, ozone may be generated (e.g., via corona discharge) remotely or proximal to the substrate or substrate path so that ozone is supplied to the substrate surface. In some embodiments, the sequence of steps 608 and 610 may be repeated two or more times (as shown at 612) before continuing to 614. In some embodiments, the sequence of steps 608 and 610 may be repeated between two and five times.

Method 600 includes, at 614, chemisorbing a second precursor on a surface supported by the substrate by exposing the surface to the other of the non-hydroxylated silicon-containing precursor or the metal-organic precursor and afterward, at 616, supplying activated oxygen species to the surface, which, in some embodiments, may be supplied in a similar manner described above. In some embodiments, the sequence of steps 614 and 616 may be repeated two or more times (as shown at 618) before continuing to 620. In some embodiments, the sequence of steps 614 and 616 may be repeated between two and five times.

At 620, method 600 is repeated until a metal-silicon-oxide film having a thickness of 500 Ångstroms or less is formed on the substrate. In some embodiments, method 600 may be repeated until the substrate is at least encapsulated with the film.

The deposition process for aluminum-silicon-oxide, and titanium-silicon-oxide films described above, including growth rate and barrier properties, are believed to be relatively insensitive to substrate temperature. Based upon experiments performed in a range of 70 to 100 degrees Celsius, it is believed that the metal-silicon-oxide mixtures disclosed herein may be formed over a wider range of temperatures. Non-limiting temperature ranges include 50 to 120 degrees Celsius and 25 to 200 degrees Celsius.

Likewise, the deposition process is believed to be relatively insensitive to variation in total pressure. It is believed that the metal-silicon-oxide mixtures disclosed herein may be formed over a pressure range of about 0.001 Torr to 10 Torr. In some other embodiments that do not employ direct plasma (e.g., thermal activation of precursors, remote ozone generation, or remote plasma generation) pressure may be higher than 10 Torr or lower than 0.001 Torr.

For purposes of the present disclosure and claims, WVTR is determined in accordance with ASTM F1249-06(2011) "Standard Test Method for Water Vapor Transmission Rate Through Plastic Film and Sheeting Using a Modulated Infrared Sensor" at 38° C. (+/−0.1° C.) and 90% RH, but with a test instrument configured with a coulometric sensor including electrodes coated with phosphorous pentoxide ($P_2O_5$) rather than a modulated infra-red sensor. In the experimental results set forth below, the WVTR measurements were made either using a MOCON Aquatran® WVTR measurement instrument (indicated as Instrument "MOC") or an Illinois Instruments Model 7001 WVTR test system (indicated as Instrument "II"). Both the MOCON Aquatran and Illinois Instruments 7001 test systems implement ASTM F1249 with a coulometric sensor including electrodes coated with $P_2O_5$ for improved sensitivity over an infra-red sensor. The MOCON Aquatran instrument has a reliable lower measurement limit of approximately $5\times10^{-4}$ g/m²/day, whereas test instruments implementing an infra-red sensor typically have a lower limit of approximately $5\times10^{-2}$ g/m²/day. Other available test method specifications include DIN EN ISO 15106-3 (2005). It is possible that over time improved test methods, sensors, and instruments will be developed or discovered to provide improved sensitivity, with lower limits down to $5\times10^{-6}$ g/m²/day or lower, and improved accuracy; and that recognized standards will be adopted for such improved test methods. To the extent that future test methods, sensors, instruments, and standards provide improvements in sensitivity and accuracy over the test methods used to gather WVTR data disclosed herein, they may be used to determine WVTR under the claims.

It will be obvious to those having skill in the art that many changes may be made to the details of the above-described embodiments without departing from the underlying principles of the invention. The scope of the present invention should, therefore, be determined only by the following claims.

The invention claimed is:

1. A moisture barrier deposited on a substrate, the barrier comprising a thin film of a metal-silicon-oxide mixture formed from a non-hydroxylated silicon-containing precursor and a metal-containing precursor, the barrier being less than 500 Ångstroms thick and having a refractive index of 1.8 or less.

2. The moisture barrier of claim 1, wherein the moisture barrier has a refractive index of between 1.5 and 1.8.

3. The moisture barrier of claim 1, wherein the moisture barrier has a water vapor transmission rate of $3\times10^{-1}$ g/m²/day or less.

4. The moisture barrier of claim 1, where the metal-silicon-oxide film consists essentially of a film selected from the group consisting of a AlSiO film, a TiSiO film, and a ZnSiO film.

5. The moisture barrier of claim 1, wherein the substrate is a flexible polymer film having a glass transition temperature of about 200 degrees Celsius or less.

6. The moisture barrier of claim 1, wherein the substrate is a flexible polymer film having a refractive index of 1.8 or less.

7. The moisture barrier of claim 1, wherein the moisture barrier encapsulates the substrate.

8. The moisture barrier of claim 1, wherein the substrate is rigid.

9. The moisture barrier of claim 1, wherein the substrate includes an OLED display.

10. The moisture barrier of claim 1, wherein the substrate includes a lighting panel.

11. A moisture barrier deposited on a substrate, the barrier comprising a thin film of a metal-silicon-oxide mixture formed from a non-hydroxylated silicon-containing precursor and a metal-containing precursor, wherein the moisture barrier has a water vapor transmission rate of $3\times10^{-1}$ g/m²/day or less.

12. The moisture barrier of claim 11 having a refractive index of 1.8 or less.

13. The moisture barrier of claim 12, wherein the moisture barrier has a refractive index of between 1.5 and 1.8.

14. The moisture barrier of claim 12, wherein the moisture barrier encapsulates the substrate.

15. The moisture barrier of claim 11, where the metal-silicon-oxide film consists essentially of a film selected from the group consisting of a AlSiO film, a TiSiO film, and a ZnSiO film.

16. The moisture barrier of claim 11, wherein the substrate is a flexible polymer film having a glass transition temperature of about 200 degrees Celsius or less.

17. The moisture barrier of claim 11, wherein the substrate is a flexible polymer film having a refractive index of 1.8 or less.

18. The moisture barrier of claim 11, wherein the substrate is rigid.

19. The moisture barrier of claim 11, wherein the substrate includes an OLED display.

20. The moisture barrier of claim 11, wherein the substrate includes a lighting panel.

* * * * *

UNITED STATES PATENT AND TRADEMARK OFFICE
CERTIFICATE OF CORRECTION

| | | |
|---|---|---|
| PATENT NO. | : 9,263,359 B2 | Page 1 of 1 |
| APPLICATION NO. | : 14/191235 | |
| DATED | : February 16, 2016 | |
| INVENTOR(S) | : Dickey et al. | |

It is certified that error appears in the above-identified patent and that said Letters Patent is hereby corrected as shown below:

Title Page, item (73), should read

Assignee:　　Lotus Applied Technology, LLC,
　　　　　　　Hillsboro, OR (US)
　　　　　　　Toppan Printing Co., LTD.
　　　　　　　Tokyo, Japan Signed and Sealed this
Twenty-eighth Day of June, 2016

Michelle K. Lee
*Director of the United States Patent and Trademark Office*